(12) United States Patent
Yamanobe

(10) Patent No.: US 8,947,112 B2
(45) Date of Patent: Feb. 3, 2015

(54) SWITCHING APPARATUS AND TEST APPARATUS

(75) Inventor: Itaru Yamanobe, Gunma (JP)

(73) Assignee: Advantest Corporation, Tokyo (JP)

( * ) Notice: Subject to any disclaimer, the term of this patent is extended or adjusted under 35 U.S.C. 154(b) by 520 days.

(21) Appl. No.: 13/118,472

(22) Filed: May 30, 2011

(65) Prior Publication Data

US 2012/0139567 A1    Jun. 7, 2012

Related U.S. Application Data

(63) Continuation of application No. PCT/JP2009/006473, filed on Nov. 30, 2009.

(30) Foreign Application Priority Data

Dec. 26, 2008    (JP) .................................. 2008-334617

(51) Int. Cl.
| | | |
|---|---|---|
| *G01R 31/00* | (2006.01) | |
| *H02J 4/00* | (2006.01) | |
| *H03K 17/28* | (2006.01) | |
| *H02J 1/00* | (2006.01) | |
| *G01R 31/28* | (2006.01) | |

(52) U.S. Cl.
CPC ............ *H03K 17/28* (2013.01); *G01R 31/2889* (2013.01)
USPC ........... 324/750.01; 307/75; 307/80; 327/365

(58) Field of Classification Search
CPC ............ G01R 31/2623; G01R 31/261; G01R 31/2617; G01R 31/31924; H03K 4/693; H02J 1/10; G06F 1/26
USPC .......... 324/762.08, 762.09, 768, 769, 750.01; 327/108, 381, 380
See application file for complete search history.

(56) References Cited

U.S. PATENT DOCUMENTS

| | | | |
|---|---|---|---|
| 5,764,097 A | | 6/1998 | Whitfield |
| 6,216,099 B1 * | | 4/2001 | Fang et al. ...................... 703/15 |

(Continued)

FOREIGN PATENT DOCUMENTS

| | | |
|---|---|---|
| JP | H04-213213 A | 8/1992 |
| JP | H06-125252 A | 5/1994 |

(Continued)

OTHER PUBLICATIONS

English translation of Written Opinion (IB338) for International application No. PCT/JP2009/006473 mailed on Aug. 25, 2011.

(Continued)

*Primary Examiner* — Jermele M Hollington
*Assistant Examiner* — Hoang X Nguyen

(57) ABSTRACT

Provided is a switching apparatus that switches a connection state between two terminals, comprising a switch that switches the connection state between the two terminals according to a control voltage supplied thereto; a driving section that provides the switch with the control voltage corresponding to a control signal supplied thereto; and a changing section that changes the control voltage output from the driving section, according to a designated switching time. The changing section may change power supplied as a power supply to the driving section, according to the designated switching time. The changing section may change the control voltage output from the driving section prior to switching of the switch.

11 Claims, 11 Drawing Sheets

(56) References Cited

U.S. PATENT DOCUMENTS

| | | |
|---|---|---|
| 7,511,527 B1 * | 3/2009 | Tiew et al. ............... 324/762.08 |
| 2005/0088167 A1 | 4/2005 | Miller |
| 2005/0207228 A1 | 9/2005 | Yamashita et al. |
| 2006/0120004 A1 * | 6/2006 | Thiery et al. .................. 361/118 |
| 2007/0274132 A1 * | 11/2007 | Ogiwara et al. ......... 365/185.23 |
| 2009/0066402 A1 * | 3/2009 | Hiyama ........................ 327/392 |

FOREIGN PATENT DOCUMENTS

| | | |
|---|---|---|
| JP | 08-33330 A | 2/1996 |
| JP | 2000-232347 A | 8/2000 |
| JP | 2005-267700 A | 9/2005 |
| JP | 2005-340793 A | 12/2005 |
| JP | 2007-509589 A | 4/2007 |
| JP | 3941309 B2 | 7/2007 |
| JP | 2008-108103 A | 5/2008 |

OTHER PUBLICATIONS

International Search Report (ISR) for International application No. PCT/JP2009/006473 mailed on Dec. 28, 2009.

Preliminary Notice of First Office Action dated Jan. 28, 2013 issued by the Taiwan Intellectual Property Office.

Notice of Reasons for Rejection of Japanese Patent Application No. 2010-543786, issued by the Japanese Patent Office on Jul. 23, 2013.

* cited by examiner

SWITCHING APPARATUS AND TEST APPARATUS

BACKGROUND

1. Technical Field

The present invention relates to a switching apparatus and a test apparatus.

2. Related Art

A conventional voltage-controlled switch is known, such as a field-effect transistor (FET). Such a switch requires a prescribed switching time when turning ON and OFF.

In the field of test apparatuses for testing devices, there are cases where the switching time of a switch is controlled. However, a drive circuit capable of controlling the switching time of a switch has a complicated configuration.

For example, Patent Document 1 describes a drive circuit that controls the switching time of an insulated gate bipolar transistor (IGBT). In the drive circuit of Patent Document 1, however, the drive voltage must be increased when it is detected that the collector voltage or the like reaches a prescribed voltage, and this results in a complicated configuration.

Patent Document 1: Japanese Patent No. 3941309

SUMMARY

Therefore, it is an object of an aspect of the innovations herein to provide a switching apparatus and a test apparatus, which are capable of overcoming the above drawbacks accompanying the related art. The above and other objects can be achieved by combinations described in the independent claims.

According to a first aspect of the present invention, provided is a switching apparatus that switches a connection state between two terminals, comprising a switch that switches the connection state between the two terminals according to a control voltage supplied thereto; a driving section that provides the switch with the control voltage corresponding to a control signal supplied thereto; and a changing section that changes the control voltage output from the driving section, according to a designated switching time.

According to a second aspect of the present invention, provided is a test apparatus that tests a device under test, comprising a signal supplying section that supplies a test signal to the device under test; a signal acquiring section that acquires a response signal output from the device under test in response to the test signal; and a judging section that judges pass/fail of the device under test based on the response signal. The signal supplying section includes an output terminal connected to the device under test; a high-voltage switching apparatus that provides a connection or a disconnection between a first terminal provided with a high reference voltage and a second terminal connected to the output terminal, according to a positive control signal corresponding to a test pattern for testing the device under test; and a low-voltage switching apparatus that provides a connection or a disconnection between a first terminal connected to the output terminal and a second terminal provided with a low reference voltage, according to a negative control signal obtained by inverting a logic value of the positive control signal. The high-voltage switching apparatus and the low-voltage switching apparatus each include a switch that switches a connection state between the first terminal and the second terminal, according to a control voltage supplied thereto; a driving section that supplies the switch with the control voltage corresponding to a control signal supplied thereto; and a changing section that changes the control voltage output from the driving section, according to a designated switching time.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
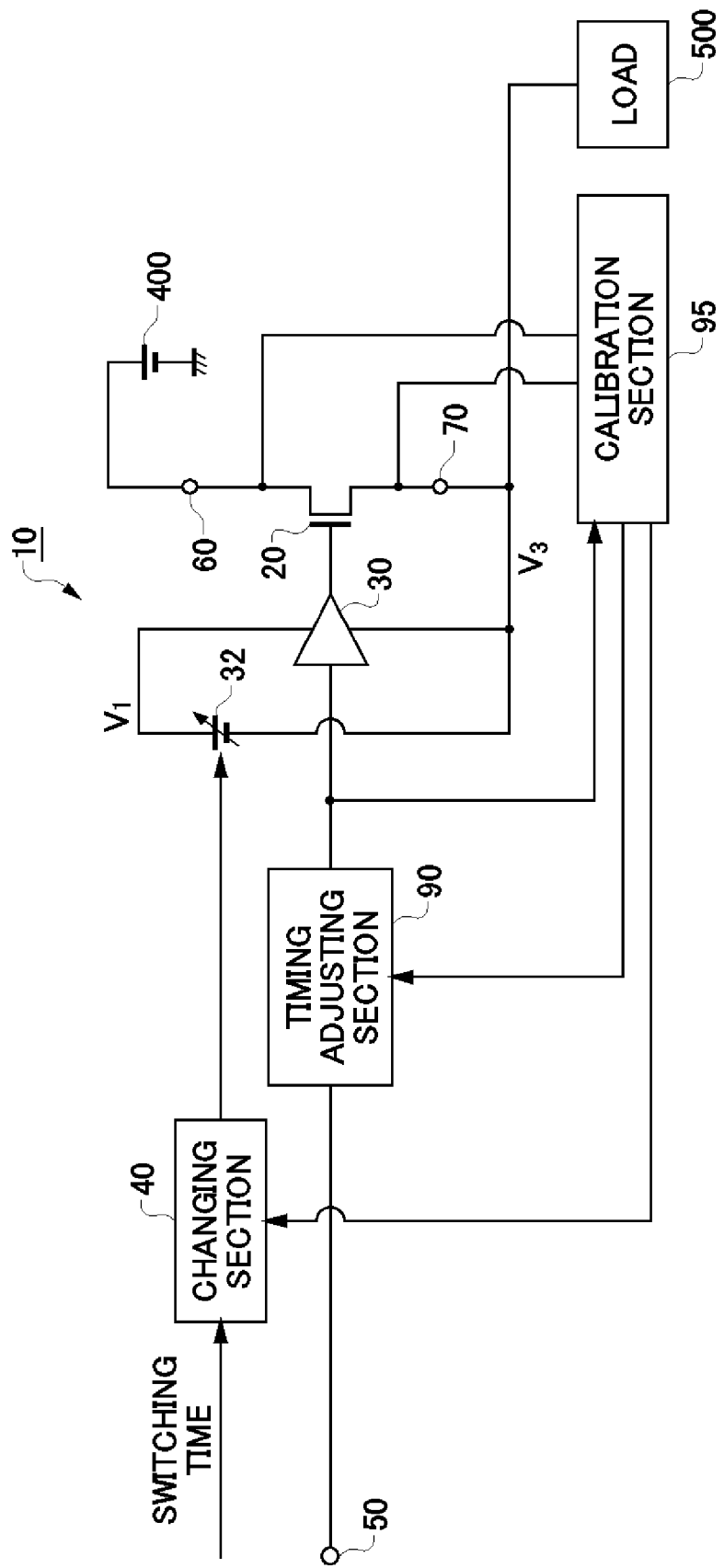
FIG. 1 shows an exemplary configuration of a switching apparatus 10.

FIG. 1 shows an exemplary configuration of a switching apparatus 10. The switching apparatus 10 includes a field-effect transistor (FET) 20, a driving section 30, a first power supply section 32, a changing section 40, a control signal input terminal 50, a first terminal 60, a second terminal 70, a timing adjusting section 90, and a calibration section 95. The switching apparatus 10 switches a connection state between the first terminal 60 and the second terminal 70, according to a switch control signal input to the control signal input terminal 50. In the example of FIG. 1, a voltage source 400 is connected to the first terminal 60 and a load 500 is connected to the second terminal 70. The switching apparatus 10 switches whether the voltage source 400 and the load 500 are connected to each other.

The FET 20 is an example of a switch. The FET 20 may be a MOSFET. The gate terminal of the FET 20 is connected to an output terminal of the driving section 30. The drain terminal of the FET 20 is connected to the first terminal 60. The source terminal of the FET 20 is connected to the second terminal 70.

If the FET 20 is a switch that switches the connection state between the first terminal 60 and the second terminal 70 according to the control voltage supplied thereto, another type of device may be used instead of the FET 20. For example, the FET 20 may be an IGBT or the like.

The driving section 30 applies a control voltage corresponding to the switch control signal supplied thereto to the gate of the FET 20. The driving section 30 receives the switch control signal input to the control signal input terminal 50. The switch control signal indicates switching instructions for switching the connection state of the FET 20. Upon receiving the control signal indicating the FET 20 is to be in the connected state, the driving section 30 supplies a control voltage with a third voltage value $V_3$ to the FET 20 using power generated by the first power supply section 32. Upon receiving the control signal indicating the FET 20 is to be in the disconnected state, the driving section 30 supplies the control voltage with a first voltage value $V_1$ to the FET 20 using power generated by the first power supply section 32.

The first power supply section 32 generates the power supply voltage with the first voltage value $V_1$. The first power supply section 32 may generate the power supply voltage with the first voltage value $V_1$ from a first output terminal, which is the positive terminal in FIG. 1. The first power supply section 32 may generate the power supply voltage with the third voltage value $V_3$ from a second output terminal, which is the negative terminal in FIG. 1. The first voltage value $V_1$ may be lower than the third voltage value $V_3$, or may be higher than the third voltage value $V_3$. In the example of FIG. 1, the second output terminal of the first power supply section 32 is connected to the source terminal of the FET 20, and so source terminal of the FET 20 has the third voltage value $V_3$. Instead, another voltage may be applied to the source terminal of the FET 20 by not connecting the second output terminal of the first power supply section 32 to the source terminal of the FET 20. In this case, the third voltage value $V_3$ may be lower than the voltage applied to the source terminal of the FET 20.

In the present embodiment, the first voltage value $V_1$ of the first power supply section 32 can be changed from the outside. For example, the first power supply section 32 may be supplied from the outside with data indicating the first voltage value $V_1$ to be generated, and may generate a power supply voltage with a value corresponding to the data supplied thereto.

The changing section 40 changes the control voltage output from the driving section 30, according to a designated switching timing. More specifically, the changing section 40 sets the first voltage value $V_1$ supplied by the first power supply section 32 from the first output terminal to the driving section 30, according to the designated switching time. The first voltage value $V_1$ is supplied to the gate terminal of the FET 20 as the control voltage, when the control signal is received indicating a disconnected state for the FET 20. Accordingly, the settings applied to the first power supply section 32 by the changing section 40 ultimately determine the switching time and the switching start timing of the FET 20. The changing section 40 may change the control voltage used when setting the FET 20 in the disconnected state in a range from the threshold voltage $Vgs_{(TH)}$ of the FET 20 to the maximum rated voltage of the gate voltage.

The timing adjusting section 90 adjusts the timing at which the switch control signal input to the control signal input terminal 50 is supplied to the driving section 30, according to the set change of the first voltage value $V_1$ by the changing section 40. The timing adjusting section 90 may be a variable delay circuit. The timing adjusting section 90 adjusts the timing at which the switch control signal input to the control signal input terminal 50 is supplied to the driving section 30. For example, when increasing the first voltage value $V_1$, the switching start timing becomes earlier, and therefore the timing adjusting section 90 may delay, or further delay, the timing at which the switch control signal is supplied, in order to start the switching at a constant timing regardless of the first voltage value $V_1$.

The switching apparatus 10 need not include the timing adjusting section 90, in which case the switching apparatus 10 may adjust the timing at which the switch control signal is supplied to the driving section 30 via the source that supplies the switch control signal. In this case, the switch control signal input to the control signal input terminal 50 may be supplied directly to the driving section 30.

The calibration section 95 detects the control voltage Vgs corresponding to the designated switching time, prior to the switching of the FET 20. More specifically, the calibration section 95 receives the switch control signal input to the control signal input terminal 50 and measures the drain-source junction voltage Vds of the FET 20 or the change in output voltage supplied to the load 500 corresponding to the switch control signal. For example, the calibration section 95 may gradually change the first voltage value $V_1$ supplied to the driving section 30 and, for each change of the first voltage value $V_1$, measure the time from the switching start timing to a timing at which the voltage between the first terminal 60 and the second terminal 70, i.e. the drain-source junction voltage Vds, reaches a prescribed voltage. In this way, the calibration section 95 can detect the control voltage corresponding to the designated switching time. As another example, the calibration section 95 may gradually change the first voltage value $V_1$ supplied to the driving section 30 and, for each change of the first voltage value $V_1$, measure the time from the switching start timing to a timing at which the output voltage applied to the load 500 reaches a prescribed voltage. In this way, the calibration section 95 can detect the control voltage corresponding to the designated switching time. Before the switching apparatus 10 is actually used, the calibration section 95 may obtain the setting values of the changing section 40 corresponding to the designated switching time.

The calibration section 95 may obtain an appropriate switch control signal supply timing for cancelling out the change in the switching start timing corresponding to the control voltage Vgs, and set the adjustment amount of the timing adjusting section 90. If the switching apparatus 10 does not include the timing adjusting section 90, the source that supplies the switch control signal may be provided with the appropriate switch control signal supply timing as timing calibration information.

Figure 2A:
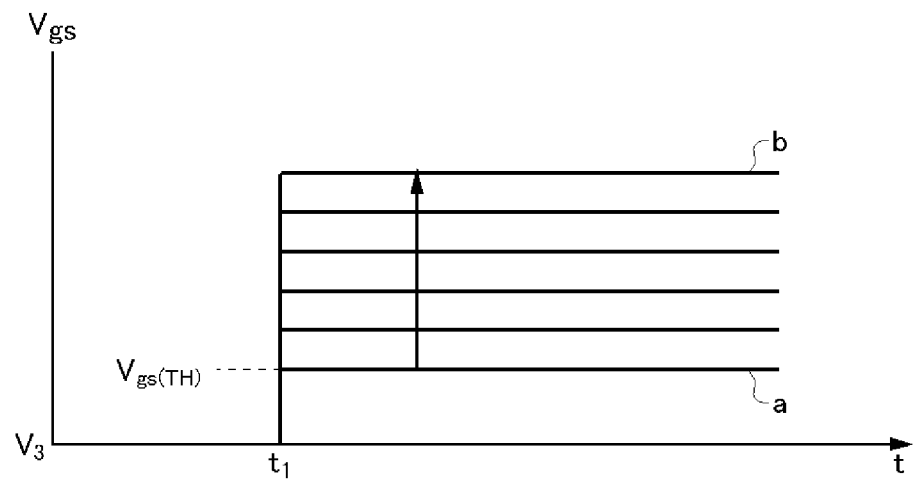
FIG. 2A shows waveforms of the voltage Vgs applied to the gate-source junction of the FET 20 by the driving section 30.
Figure 2B:
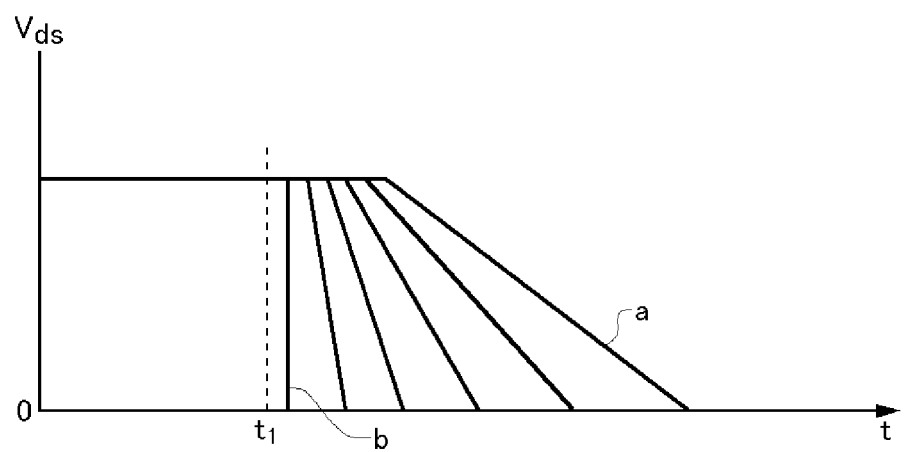
FIG. 2B shows waveforms of the drain-source junction voltage Vds of the FET 20 when the voltage Vgs waveforms shown in FIG. 2A are applied.

FIG. 2A shows waveforms occurring when the voltage Vgs applied to the gate-source junction of the FET 20 by the driving section 30 is increased from 0 V to prescribed voltages at time $t_1$. FIG. 2A shows a plurality of waveforms for which the amount of the increase in the voltage Vgs at time $t_1$ is within a range from the threshold voltage $Vgs_{(TH)}$ of the FET 20 (waveform "a") to a voltage near the maximum rated gate voltage (waveform "b"). FIG. 2B shows waveforms of the drain-source junction voltage Vds of the FET 20 corresponding to each of the voltage Vgs waveforms from waveform "a" to waveform "b." As shown in FIGS. 2A and 2B, the FET 20 switches the connection state (connected/disconnected) between the first terminal 60 and the second terminal 70 according to the control voltage Vgs applied to the gate-source junction of the FET 20. More specifically, the first terminal 60 and the second terminal 70 are in a connected state when the control voltage Vgs is 0 V, and are in a disconnected state when the control voltage Vgs is greater than or equal to the threshold voltage $Vgs_{(TH)}$.

As shown in FIGS. 2A and 2B, the switching time of the FET 20 is shorter when the difference between the control voltage value output to set the FET 20 in the disconnected state and the threshold voltage $Vgs_{(TH)}$ of the FET 20 is greater, in other words, when a greater than normal voltage is applied as Vgs. Furthermore, the switching start timing of the FET 20 is earlier when the difference between the control voltage value to set the FET 20 in the disconnected state and control voltage value to set the FET 20 in the connected state is greater.

Figure 3:
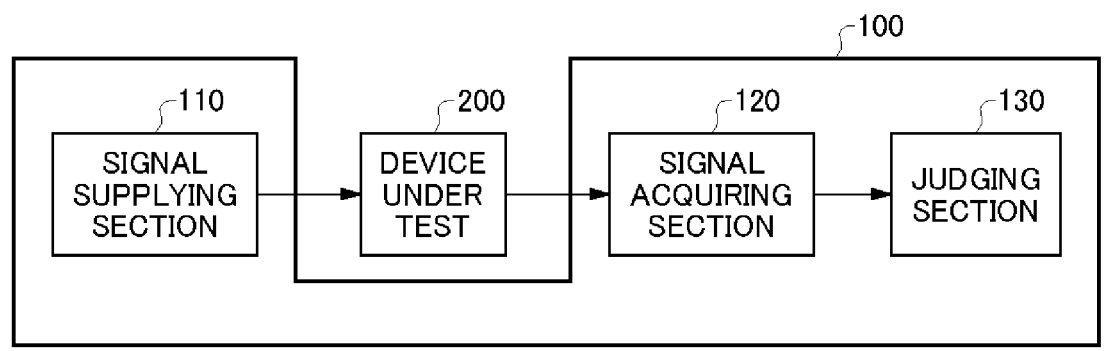
FIG. 3 shows a configuration of a test apparatus 100 for testing a device under test 200.

FIG. 3 shows a configuration of a test apparatus 100 for testing a device under test 200. The test apparatus 100 includes a signal supplying section 110, a signal acquiring section 120, and a judging section 130. The signal supplying section 110 supplies a test signal to the device under test 200. The signal acquiring section 120 acquires a response signal output from the device under test 200. The judging section 130 judges pass/fail of the device under test 200 based on the response signal acquired by the signal acquiring section 120.

Figure 4:
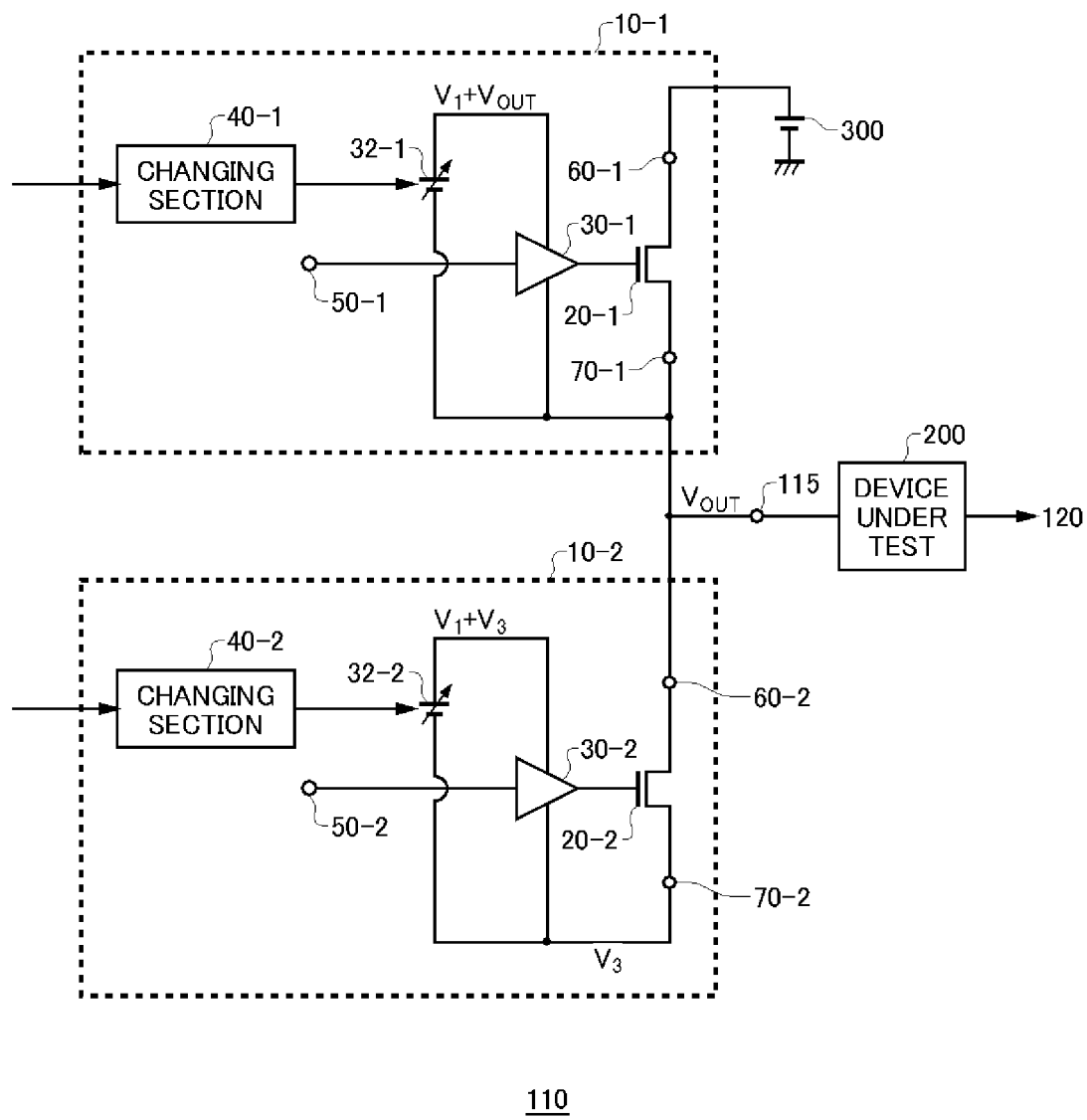
FIG. 4 shows an exemplary configuration of the signal supplying section 110.

FIG. 4 shows an exemplary modification of the configuration of the signal supplying section 110. The signal supplying section 110 includes a switching apparatus 10-1, a switching apparatus 10-2, an output terminal 115, and a high reference voltage 300. The switching apparatus 10-1 and the switching apparatus 10-2 may each have the same configuration as the switching apparatus 10 described in relation to FIG. 1. Specifically, a FET 20-1, a driving section 30-1, a first power supply section 32-1, a changing section 40-1, a control signal input terminal 50-1, a first terminal 60-1, and a second terminal 70-1 of the switching apparatus 10-1 may respectively be the same as the FET 20, the driving section 30, the first power supply section 32, the changing section 40, the control signal input terminal 50, the first terminal 60, and the second terminal 70 in FIG. 1. Similarly, a FET 20-2, a driving section 30-2, a first power supply section 32-2, a changing section 40-2, a control signal input terminal 50-2, a first terminal 60-2, and a second terminal 70-2 of the switching apparatus 10-2 may respectively be the same as the FET 20, the driving section 30, the first power supply section 32, the changing section 40, the control signal input terminal 50, the first terminal 60, and the second terminal 70 in FIG. 1. For ease of explanation, the switching apparatus 10-1 and the switching apparatus 10-2 in the present embodiment do not include the timing adjusting section 90 or the calibration section 95, but the timing adjusting section 90 and the calibration section 95 may be included as desired.

The first terminal 60-1 of the switching apparatus 10-1 is connected to the high reference voltage 300 that supplies the high reference voltage. The second terminal 70-2 of the switching apparatus 10-2 is connected to the second output terminal of the first power supply section 32-2, and is supplied with the third voltage value $V_3$. In the present embodiment, the third voltage value $V_3$ is the low reference voltage. As another example, a voltage other than the third voltage value $V_3$ may be supplied to the second terminal 70-2 of the switching apparatus 10-2 as the low reference voltage, without connecting the second output terminal of the first power supply section 32-2 to the source terminal of the FET 20-2. The second terminal 70-1 of the switching apparatus 10-2 is connected to the first terminal 60-2 of the switching apparatus 10-2. The output terminal 115 connected to the device under test 200 is provided at a node connected to both the second terminal 70-1 of the switching apparatus 10-1 and the first terminal 60-2 of the switching apparatus 10-2.

In the signal supplying section 110 shown in FIG. 4, the second output terminal of the first power supply section 32-1 of the switching apparatus 10-1 is connected to the output terminal 115 and/or the second terminal 70-1, and generates a power supply voltage that is greater than the voltage $V_{OUT}$ occurring at the output terminal 115 from the first output terminal by the first voltage value $V_1$. Upon receiving a control signal for setting the FET 20-1 to a connected state, which may be an L signal, the driving section 30-1 applies the voltage $V_{OUT}$ occurring at the output terminal 115 to the FET 20-1. Upon receiving a control signal for setting the FET 20-1 to a disconnected state, which may be an H signal, the driving section 30-1 applies to the FET 20-1 a control voltage that is greater than the voltage $V_{OUT}$ occurring at the output terminal 115 by the first voltage value $V_1$. The second output terminal of the first power supply section 32-2 of the switching apparatus 10-2 is connected to the third voltage value $V_3$, and generates a control voltage of $V_1+V_3$, which is greater than the third voltage value $V_3$ from the first output terminal by the first voltage value $V_1$. Upon receiving a control signal for setting the FET 20-2 to a connected state, which may be an L signal, the driving section 30-2 applies the third voltage value $V_3$ to the FET 20-1. Upon receiving a control signal for setting the FET 20 to a disconnected state, which may be an H signal, the driving section 30 applies to the FET 20 the voltage of $V_1+V_3$, which is greater than the third voltage value $V_3$ from the first output terminal by the first voltage value $V_1$.

The voltage output by the first output terminal of the first power supply section 32-1 may be a prescribed voltage unrelated to the voltage $V_{OUT}$ occurring at the output terminal 115, as long as this voltage is within the rated voltage range of the gate-source junction voltage Vgs of the FET 20-1. The second output terminal of the first power supply section 32-1 need not be connected to the second terminal 70-1 of the switching apparatus 10-1, and the voltage $V_{OUT}$ occurring at the output terminal 115 may be different from the voltage supplied to the driving section 30-1. Similarly, the second output terminal of the first power supply section 32-2 need not be connected to the second terminal 70-2 of the switching apparatus 10-2, and the voltage supplied to the second terminal 70-2 of the switching apparatus 10-2 as the low reference voltage may be different from the third voltage value $V_3$ supplied to the driving section 30-2. For example, the second output terminal of the first power supply section 32-1 may supply the driving section 30-1 with a voltage lower than the voltage $V_{OUT}$ occurring at the output terminal 115, and the second output terminal of the driving section 30-2 may supply the driving section 30-2 with a voltage lower than the third voltage value $V_3$.

In the present embodiment, the first power supply section 32-1 and the first power supply section 32-2 each output a voltage that is greater than a reference voltage by the first voltage value $V_1$, but the output voltage value with respect to the reference voltage may be different for the first power supply section 32-1 and for the first power supply section 32-2, such that the switching times of the switching apparatus 10-1 and the switching apparatus 10-2 are independently controlled.

A positive control signal corresponding to a test pattern for testing the device under test 200 is input to the control signal input terminal 50-1 of the switching apparatus 10-1. A negative control signal, which is obtained by inverting the logic value of the positive control signal, is input to the control signal input terminal 50-2 of the switching apparatus 10-2. Accordingly, one of the switching apparatus 10-1 and the switching apparatus 10-2 is in the disconnected state when the other is in the connected state, and so one of the high reference voltage and the low reference voltage is output from the output terminal 115. The signal supplying section 110 supplies the device under test 200 with a test signal corresponding to the connection state of the switching apparatus 10-1 and the switching apparatus 10-2, from the output terminal 115.

The switching times of the switching apparatus 10-1 and the switching apparatus 10-2 can be respectively controlled by the changing section 40-1 and the changing section 40-2. Therefore, the signal supplying section 110 can change the rising time Tr and the falling time Tf of the test signal, according to the specifications for testing the device under test 200, by setting the changing section 40-1 and the changing section 40-2.

Figure 5:
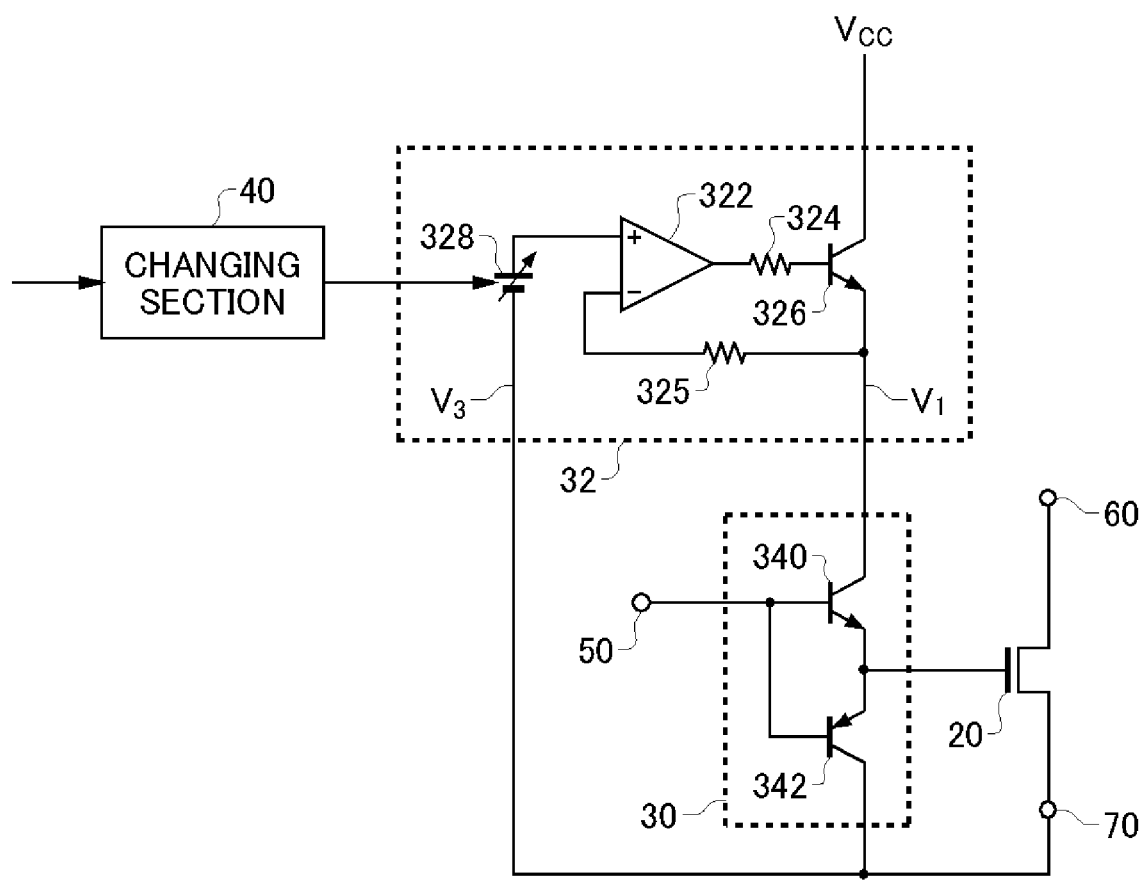
FIG. 5 shows a detailed configuration of the switching apparatus 10.

FIG. 5 shows an exemplary detailed configuration of the driving section 30 and the first power supply section 32 in the switching apparatus 10, along with other portions of the switching apparatus 10. The first power supply section 32 may include an operational amplifier 322, a resistor 324, a resistor 325, a transistor 326, and a variable voltage source 328. The operational amplifier 322, the resistor 324, the resistor 325, and the transistor 326 function as a current buffer circuit that performs current amplification on the voltage set for the variable voltage source 328. The variable voltage source 328 supplies the current buffer circuit with a voltage corresponding to the settings of the changing section 40. The variable voltage source 328 may be a DA converter, for example. The first power supply section 32 performs current amplification on the signal supplied from the variable voltage source 328, and supplies the result as the power supply voltage of the driving section 30.

The driving section 30 may be a so-called push-pull drive circuit including a first transistor 340 and a second transistor 342. The collector terminal of the first transistor 340 is connected to the first output terminal of the first power supply section 32, and is supplied with the first voltage value $V_1$ from the first power supply section 32. The emitter terminal of the first transistor 340 is connected to the emitter terminal of the second transistor 342. The collector terminal of the second transistor 342 is connected to the second output terminal of the first power supply section 32, and is supplied with the third voltage value $V_3$ from the first power supply section 32. A common switch control signal is input to the base terminals of the first transistor 340 and the second transistor 342. A node connected to the emitter terminal of the first transistor 340 and the emitter terminal of the second transistor 342 is also connected to the gate terminal of the FET 20. The control voltage supplied to the gate terminal of the FET 20 is changed between the first voltage value $V_1$ and the third voltage value $V_3$, using the power supplied from the first power supply section 32, according to the switch control signal. With the above configuration, the driving section 30 can change the control voltage to control the switching time. The first voltage value $V_1$ may be more positive than the third voltage value $V_3$, or may be more negative than the third voltage value $V_3$. In the example of FIG. 5, the second output terminal of the first power supply section 32 is connected to the source terminal of the FET 20, and the source terminal of the FET 20 has the third voltage value $V_3$. But instead, the second output terminal of the first power supply section 32 need not be connected to the source terminal of the FET 20, and another voltage may be applied to the source terminal of the FET 20. In this case, the third voltage value $V_3$ may be lower than the voltage applied to the source terminal of the FET 20.

Figure 6:
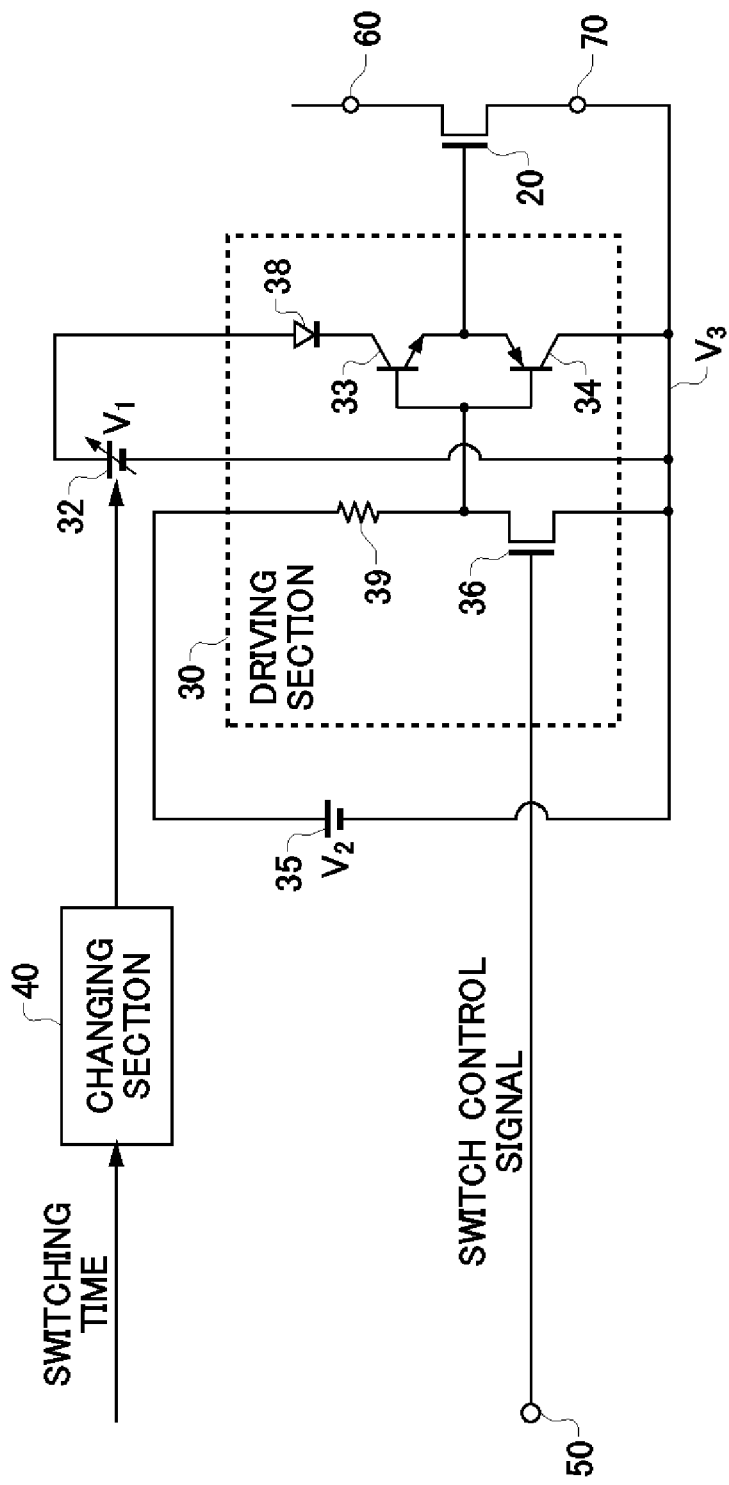
FIG. 6 shows another detailed configuration of the switching apparatus 10.

FIG. 6 shows a configuration of a switching apparatus 10 according to an embodiment of the present invention. The switching apparatus 10 switches a connection state between two terminals. More specifically, the switching apparatus 10 provides a connection or a disconnection between a first terminal 60 and a second terminal 70. The switching apparatus 10 includes a FET 20, a first power supply section 32, a second power supply section 35, a driving section 30, and a changing section 40.

The FET 20 switches a connection state between two terminals, i.e. the first terminal 60 and the second terminal 70, according to a control voltage supplied thereto. More specifically, the FET 20 provides a connection or a disconnection between two terminals according to the control voltage supplied thereto.

One of the connection state and the disconnection state between the two terminals that is switched to by the FET 20 is referred to as a first state, and the other is referred to as a second state. The FET 20 is in the first state when a control voltage with a third voltage value $V_3$ is supplied thereto, and is in the second state when a control voltage with a second voltage value $V_2$ is supplied thereto.

In the present embodiment, the drain of the FET 20 is connected to the first terminal 60 and the source of the FET 20 is connected to the second terminal 70. The control voltage is applied to the source-gate junction, which is the control end, of the FET 20. The FET 20 provides a connection or a disconnection between the first terminal 60 and the second terminal 70, according to the control voltage applied between the gate and the source thereof.

If the switching apparatus 10 is a switch that switches the connection state between the first terminal 60 and the second terminal 70 according to the control voltage supplied thereto, another type of device may be used instead of the FET 20. For example, the switching apparatus 10 may include an IGBT or the like instead of the FET 20.

The first power supply section 32 generates a power supply voltage with a first voltage value $V_1$. The first power supply section 32 may generate the power supply voltage with the first voltage value $V_1$ from a first output terminal, which is the positive terminal in FIG. 6, and may generate the power supply voltage with the third voltage value $V_3$ from a second output terminal, which is the negative terminal in FIG. 6. The first voltage value $V_1$ may be lower than the third voltage value $V_3$, or may be higher than the third voltage value $V_3$.

In the present embodiment, the first voltage value $V_1$ of the first power supply section 32 can be changed from the outside. For example, the first power supply section 32 may be supplied from the outside with data indicating the first voltage value $V_1$ to be generated, and may generate a power supply voltage with a value corresponding to the data supplied thereto.

The second power supply section 35 generates a power supply voltage with a second voltage value $V_2$. The second power supply section 35 may generate the power supply voltage with the second voltage value $V_2$ from a first output terminal, which is the positive terminal in FIG. 6. The second power supply section 35 may generate the power supply voltage with the third voltage value $V_3$ from a second output terminal, which is the negative terminal in FIG. 6. In other words, the second output terminal of the second power supply section 26 generates the same voltage as the second output terminal of the first power supply section 24.

If the third voltage value $V_3$ is used as a reference, e.g. if the third voltage value $V_3$ is 0 V, the second voltage value $V_2$ has the same polarity as first voltage value $V_1$, and the absolute value of the potential difference between the second voltage value $V_2$ and the third voltage value $V_3$ is greater than or equal to the first voltage value $V_1$. In other words, the relationship between the first voltage value $V_1$, the second voltage value $V_2$, and the third voltage value $V_3$ is such that $V_2 \geq V_1 \geq V_3$ or $V_2 \leq V_1 \leq V_3$, and $V_2 \neq V_3$. If the driving section 30 decreases the voltage generated by the second power supply section 35 and supplies the decreased voltage to the FET 20 when a control voltage with the second voltage value $V_2$ is supplied to the FET 20, the second power supply section 35 generates a voltage value obtained as the sum of the second voltage value $V_2$ and the amount of the voltage decrease.

The driving section 30 receives a control signal indicating switching instructions for switching the FET 20 to the first state or the second state. When the received control signal indicates that the FET 20 is to be in the first state, the driving section 30 supplies the FET 20 with the control voltage having the third voltage value $V_3$. When the received control signal indicates that the FET 20 is to be in the second state, the driving section 30 supplies the FET 20 with the control voltage having the second voltage value $V_2$.

The driving section 30 changes the control voltage in the following manner when the control signal indicating switching instructions for switching the FET 20 from the first state to the second state is received. In this case, the driving section 30 uses the power generated by the first power supply section 32 to change the control voltage from the third voltage value $V_3$ to the first voltage value $V_1$, and then, using the power generated by the second power supply section 35, changes the control voltage from the first voltage value $V_1$ to the second voltage value $V_2$. Furthermore, in this case, the driving section 30 changes the control voltage from the first voltage value $V_1$ to the second voltage value $V_2$ with a change rate per unit time that is lower than the change rate per unit time used when changing from the third voltage value $V_3$ to the first voltage value $V_1$.

The driving section 30 may include a first transistor 33, a second transistor 34, an input switch 36, a diode 38, and a resistor 39. The collector of the first transistor 33 is connected to the first output terminal of the first power supply section 32, and the emitter of the first transistor 33 is connected to the gate of the FET 20. The first transistor 33 is ON when the base thereof is connected to the first output terminal of the second power supply section 35, and is OFF when the base thereof is connected to the second output terminal of the second power supply section 35.

The collector of the second transistor 34 is connected to the second output terminals of the first power supply section 32 and the second power supply section 35, and the emitter of the second transistor 34 is connected to the gate of the FET 20. The second transistor 34 is OFF when the base thereof is connected to the first output terminal of the second power supply section 35, and the collector-emitter junction thereof is ON when the base thereof is connected to the second output terminal of the second power supply section 35.

The input switch 36 is receives the control signal. Upon receiving the control signal with instructions to switch the FET 20 to the first state, the input switch 36 connects the second output terminal of the second power supply section 35 to the bases of the first transistor 33 and the second transistor 34. Upon receiving the control signal with instructions to switch the FET 20 to the second state, the input switch 36 connects the first output terminal of the second power supply section 35 to the bases of the first transistor 33 and the second transistor 34.

The diode 38 is provided between the first output terminal of the first power supply section 32 and the collector of the first transistor 33. The driving section 30 prevents reverse current from flowing to the first power supply section 32 when the gate voltage of the FET 20 exceeds the first voltage value $V_1$. In other words, the diode 38 functions as a current stopping section that stop reverse current from flowing from the first output terminal of the second power supply section 35 to the first output terminal of the first power supply section 32.

The resistor 39 is provided between the first output terminal of the second power supply section 35 and the base of the first transistor 33. When the power supply voltage with the second voltage value $V_2$ generated by the first output terminal of the second power supply section 35 is applied to the gate of the FET 20, the resistor 39 functions as a resistance for suppressing current provided between the first output terminal of the second power supply section 35 and the control end of the FET 20. The resistor 39 is provided to cause the output resistance of the second power supply section 35 to be greater than the output resistance of the first power supply section 32. Therefore, if the output resistance in the second power supply section 35 is greater than the output resistance of the first power supply section 32, the driving section 30 need not include the resistor 39.

Upon receiving the control signal instructing the FET 20 to switch to the first state, the driving section 30 turns OFF the first transistor 33 and turns ON the second transistor 34. Therefore, the driving section 30 can connect the gate of the FET 20, which is control end, to the second output terminals of the first power supply section 32 and the second power supply section 35. Accordingly, in this case, the driving section 30 can switch the FET 20 to the first state by applying the control voltage with the third voltage value $V_3$ to the gate of the FET 20.

Upon receiving the control signal instructing the FET 20 to switch to the second state, the driving section 30 turns ON the first transistor 33 and turns OFF the second transistor 34. Therefore, the driving section 30 can connect the gate of the FET 20, which is control end, to the first output terminal of the second power supply section 35 generating the second voltage value $V_2$. Accordingly, in this case, the driving section 30 can switch the FET 20 to the second state by applying the control voltage with the second voltage value $V_2$ to the gate of the FET 20.

The driving section 30 described above can switch the connection state of the FET 20 according to the control signal. A detailed operation of the driving section 30 performed when instructions for switching the FET 20 from the first state to the second state are received is provided below with reference to FIGS. 7 and 8.

The changing section 40 receives a switching time designation from a user or the like. The changing section 40 changes the value of the power supply voltage, i.e. the first voltage value $V_1$, generated by the first power supply section 32 according to the designated switching time. For example, the changing section 40 may change the power supply voltage with the first voltage value $V_1$ generated by the first power supply section 32 within a range from the third voltage value $V_3$ to the second voltage value $V_2$, according to the designated switching time. Instead of changing the first voltage value $V_1$ generated by the first power supply section 32, the changing section 40 may change the amount of change per unit time used when changing the control voltage from the third voltage value $V_3$ to the first voltage value $V_1$ or may change the amount of change per unit time used when changing the control voltage from the first voltage value $V_1$ to the second voltage value $V_2$, according to the designated switching time.

Figure 7:
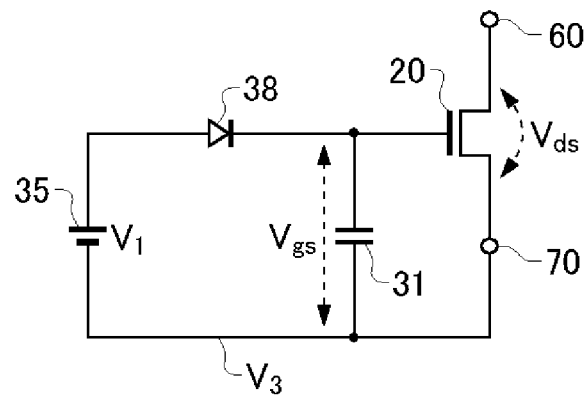
FIG. 7 shows a circuit equivalent to the driving section 30 when the first transistor 33 is ON, the second transistor 34 is OFF, and the gate voltage Vgs of the FET 20 is in a range from the third voltage value $V_3$ to the first voltage value $V_1$.

FIG. 7 shows a circuit equivalent to the driving section 30 when the first transistor 33 is ON, the second transistor 34 is OFF, and the gate voltage Vgs of the FET 20 is in a range from the third voltage value $V_3$ to the first voltage value $V_1$. Upon receiving the control signal with instructions for switching the FET 20 to the first state, the driving section 30 turns OFF the first transistor 33 and turns ON the second transistor 34 to apply the control voltage with the third voltage value $V_3$ to the gate of the FET 20. Upon receiving the control signal with instructions for switching the FET 20 from the first state to the second state, the driving section 30 changes from a state in which the first transistor 33 is OFF and the second transistor 34 is ON to a state in which the first transistor 33 is ON and the second transistor 34 is OFF.

Here, immediately after the first transistor 33 is turned OFF and the second transistor 34 is turned ON, charge is not accumulated by the gate capacitance 31 of the FET 20 and the gate voltage Vgs is the third voltage value $V_3$. When the gate voltage Vgs is in a range from the third voltage value $V_3$ to the first voltage value $V_1$, the diode 38 is ON and the first output terminal of the first power supply section 32 is connected to the gate terminal of the FET 20. Furthermore, the output resistance of the first power supply section 32 is lower than the output resistance of the second power supply section 35. As a result, when the gate voltage Vgs of the FET 20 is lower than the first voltage value $V_1$ and the first power supply section 32 and second power supply section 35 are both connected to the gate of the FET 20, the power supply current of the first power supply section 32 is dominantly supplied to the gate capacitance 31 and the power supply current of the second power supply section 35 is barely supplied to the gate capacitance 31.

Accordingly, when instructions are received to switch the FET 20 from the first state to the second state, with the gate voltage Vgs in a range from the third voltage value $V_3$ to the first voltage value $V_1$, the driving section 30 supplies the gate capacitance 31 via the diode 38 with the power supply current output by the first power supply section 32, and does not significantly supply the gate capacitance 31 with the power supply current output by the second power supply section 35. In other words, the driving section 30 applies the power supply voltage generated by the first power supply section 32 to the FET 20 as the control voltage, i.e. the gate voltage Vgs. As a result, upon receiving the instructions to switch the FET 20 from the first state to the second state, the driving section 30 can use the power generated by the first power supply section 32 to change the control voltage from the third voltage value $V_3$ to the first voltage value $V_1$.

Figure 8:
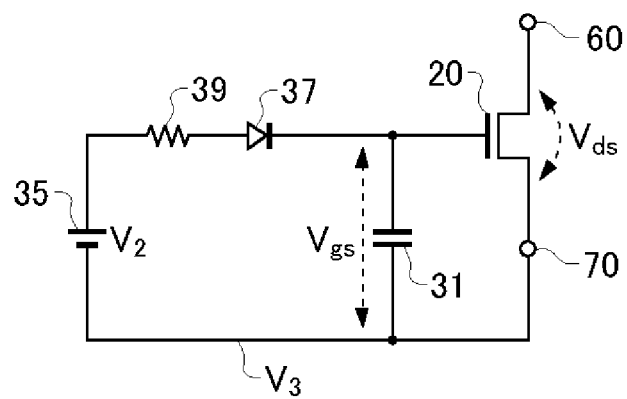
FIG. 8 shows a circuit equivalent to the driving section 30 when the first transistor 33 is ON, the second transistor 34 is OFF, and the gate voltage Vgs of the FET 20 is in a range from the first voltage value $V_1$ to the second voltage value $V_2$.

FIG. 8 shows a circuit equivalent to the driving section 30 when the first transistor 33 is ON, the second transistor 34 is OFF, and the gate voltage Vgs of the FET 20 is in a range from the first voltage value $V_1$ to the second voltage value $V_2$. When charge is accumulated by the gate capacitance 31 of the FET 20 and the gate voltage Vgs of the FET 20 reaches the first voltage value $V_1$, the diode 38 is turned OFF and the first output terminal of the first power supply section 32 is disconnected from the gate terminal of the FET 20.

Accordingly, upon receiving instructions to switch the FET 20 from the first state to the second state, with the gate voltage Vgs in a range from the first voltage value $V_1$ to the second voltage value $V_2$, the driving section 30 supplies the gate capacitance 31 via the base-emitter junction diode component 37 with the power supply current output by the second power supply section 35. In other words, the driving section 30 applies the power supply voltage generated by the second power supply section 35 to the FET 20 as the control voltage, i.e. the gate voltage Vgs. As a result, upon receiving instructions to switch the FET 20 from the first state to the second state, the driving section 30 can use the power generated by the second power supply section 35 to change the gate voltage Vgs, i.e. the control voltage, of the FET 20 from the first voltage value $V_1$ to the second voltage value $V_2$, in the same direction as the change from the third voltage value $V_3$ to the first voltage value $V_1$.

Furthermore, the output resistance of the second power supply section 35 is higher than the output resistance of the first power supply section 32. Accordingly, the current that the driving section 30 supplies to the gate capacitance 31 when the gate voltage Vgs is in a range from the first voltage value $V_1$ to the second voltage value $V_2$ is less than the current that the driving section 30 supplies to the gate capacitance 31 when the gate voltage Vgs is in a range from the third voltage value $V_3$ to the first voltage value $V_1$. As a result, the driving section 30 can set the amount of change per unit time when the gate control voltage Vgs, i.e. control voltage, of the FET 20 changes from the first voltage value $V_1$ to the second voltage value $V_2$ to be lower than the amount of change per unit time when the gate control voltage Vgs of the FET 20 changes from the third voltage value $V_3$ to the first voltage value $V_1$.

When charge is further accumulated by the gate capacitance 31 of the FET 20 and the gate voltage Vgs of the FET 20 reaches the second voltage value $V_2$, the accumulation of charge by the gate capacitance 31 of the FET 20 is stopped. As a result, the driving section 30 can apply the control voltage with the second voltage value $V_2$ to the FET 20.

Figure 9:
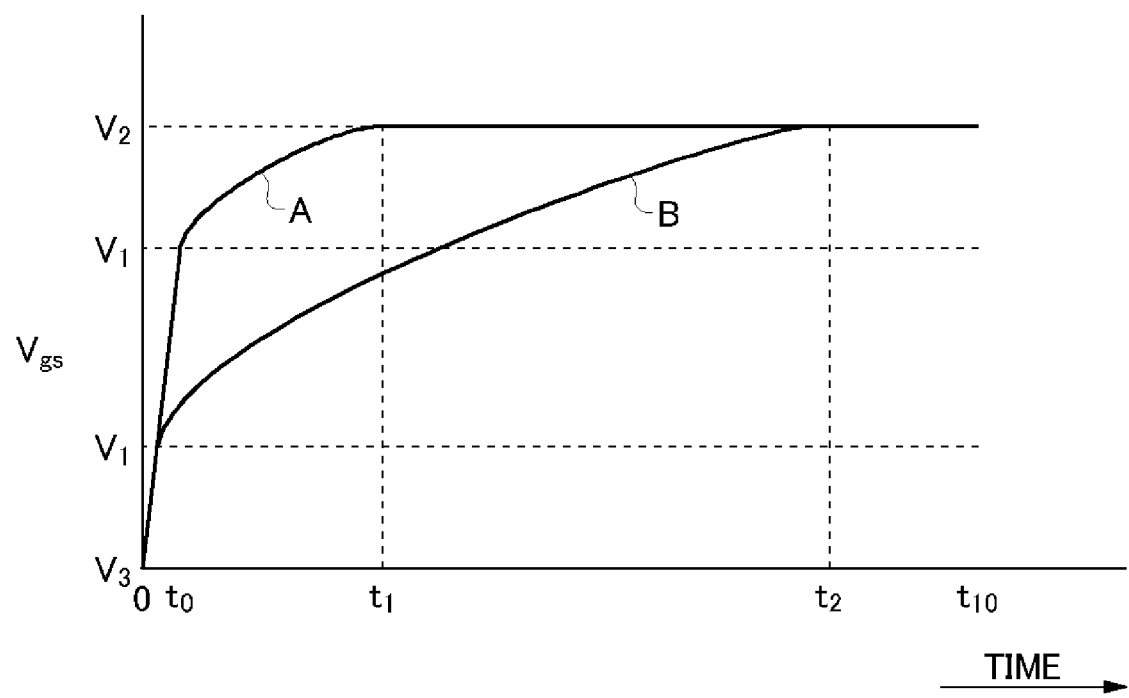
FIG. 9 shows exemplary changes over time of the gate voltage Vgs, i.e. the control voltage, of the FET 20 when the first voltage value $V_1$ is changed.
Figure 10:
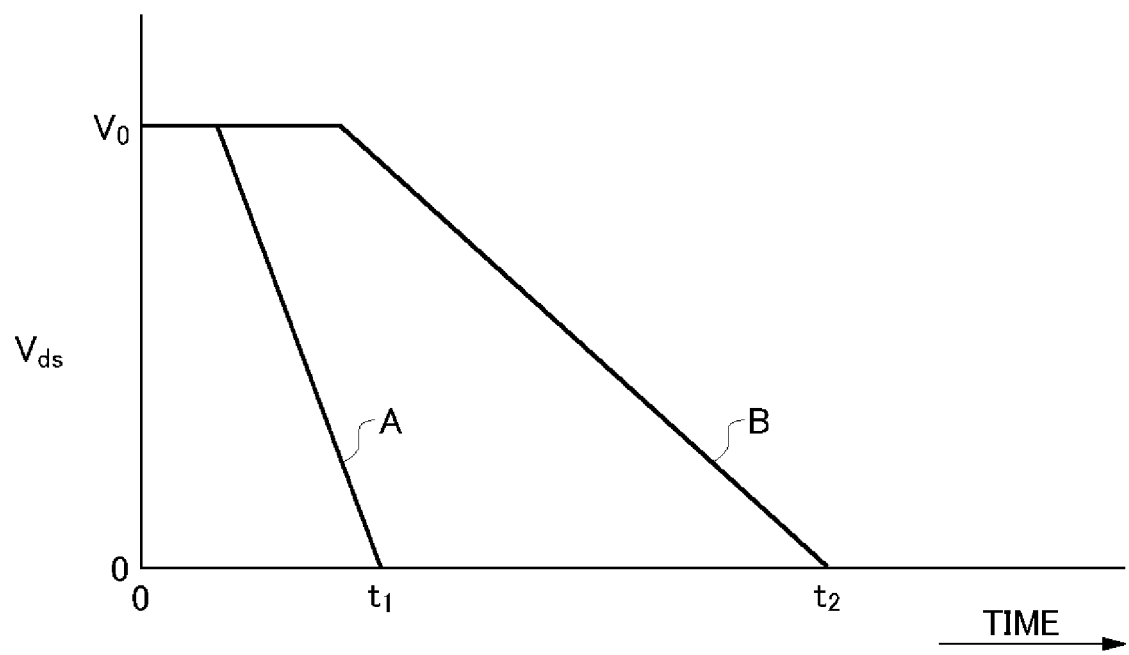
FIG. 10 shows exemplary changes over time of a drain-source junction voltage of the FET 20 when the first voltage value $V_1$ is changed.

FIG. 9 shows exemplary changes over time of the gate voltage Vgs, i.e. the control voltage, of the FET 20 when the first voltage value $V_1$ is changed. FIG. 10 shows exemplary changes over time of a drain-source junction voltage of the FET 20 when the first voltage value $V_1$ is changed.

In FIGS. 9 and 10, A represents an example in which the first voltage value $V_1$ is set to be near the second voltage value $V_2$, and B represents an example in which the first voltage value $V_1$ is set to be further from the second voltage value $V_2$ than in the example A.

In the present embodiment, the changing section 40 can change the power supply voltage with the first voltage value $V_1$ generated by the first power supply section 32 within a range from the third voltage value $V_3$ to the second voltage value $V_2$. Here, when the first voltage value $V_1$ is set to be closer to the second voltage value $V_2$, the power supply voltage generated by the first power supply section 32 is used, and the rate of change of the control voltage is larger than when the first voltage value $V_1$ is set farther from the second voltage value $V_2$. Accordingly, when the first voltage value $V_1$ is set closer to the second voltage value $V_2$, the switching time of the FET 20 is shorter. In other words, the switching time of the FET 20 becomes shorter the closer the first voltage value $V_1$ is set to the second voltage value $V_2$.

Accordingly, the changing section 40 changes the first voltage value $V_1$ to be closer to the second voltage value $V_2$ when shortening the switching time, and changes the first voltage value $V_1$ to be further from the second voltage value $V_2$ when lengthening the switching time. As a result, the changing section 40 can adjust the switching time when switching the FET 20 from the first state to the second state, according to the designated switching time.

Figure 11:
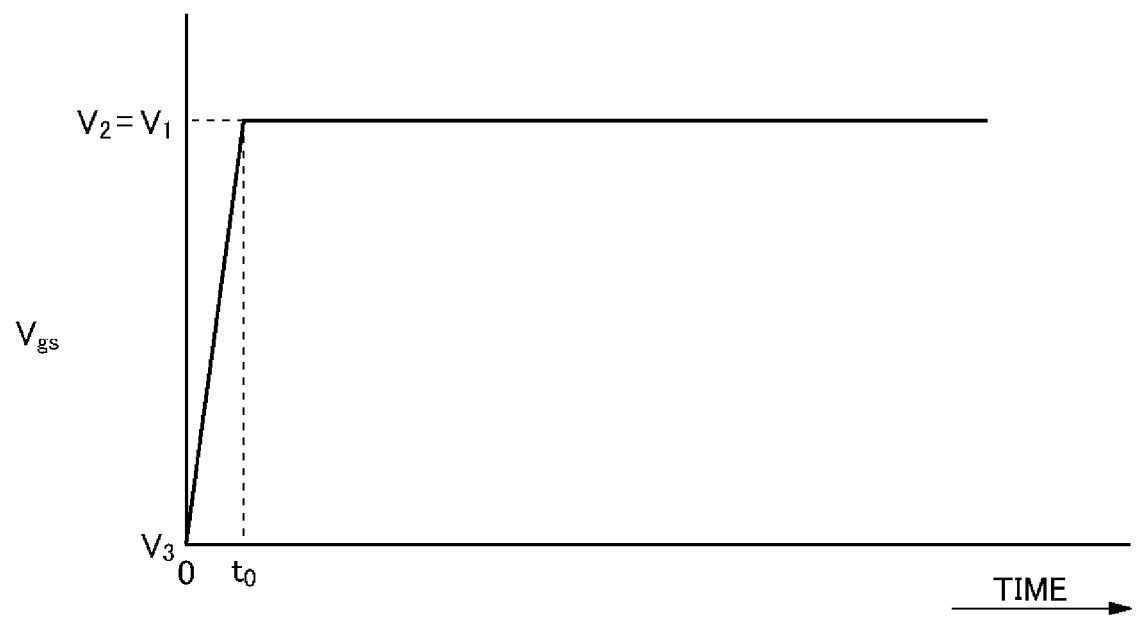
FIG. 11 shows an exemplary change over time of the gate voltage Vgs, i.e. the control voltage, of the FET 20 when the first voltage value $V_1$ is equal to the second voltage value $V_2$.
Figure 12:
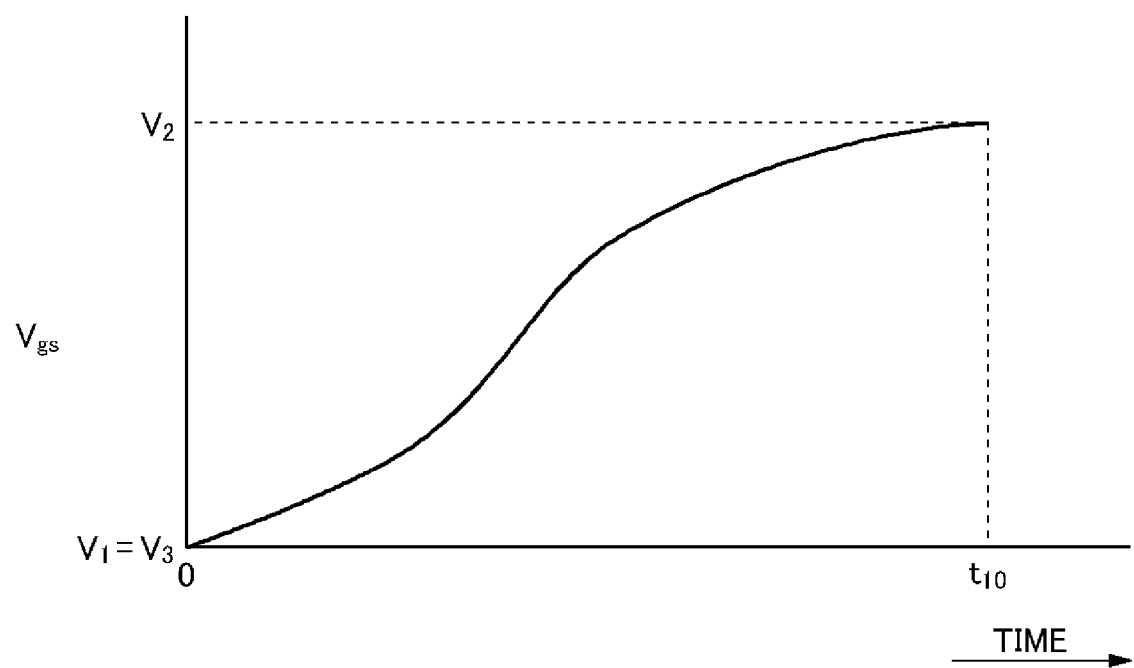
FIG. 12 shows an exemplary change over time of the gate voltage Vgs, i.e. the control voltage, of the FET 20 when the first voltage value $V_1$ is equal to the third voltage value $V_3$.

FIG. 11 shows an exemplary change over time of the gate voltage Vgs, i.e. the control voltage, of the FET 20 when the first voltage value $V_1$ is equal to the second voltage value $V_2$. FIG. 12 shows an exemplary change over time of the gate voltage Vgs, i.e. the control voltage, of the FET 20 when the first voltage value $V_1$ is equal to the third voltage value $V_3$.

The changing section 40 may set the power supply voltage with the first voltage value $V_1$ generated by the first power supply section 32 to be equal to the second voltage value $V_2$. When the first voltage value $V_1$ is equal to the second voltage value $V_2$, the driving section 30 can use the power generated by the first power supply section 32 to change the gate voltage Vgs, i.e. the control voltage, of the FET 20 from the third voltage value $V_3$ to the second voltage value $V_2$, while using almost none of the power generated by the second power supply section 35. In this case, the driving section 30 can shorten the switching time of the FET 20 by the maximum amount, as shown by $t_0$ in FIG. 11.

The changing section 40 may set the power supply voltage with the first voltage value $V_1$ generated by the first power supply section 32 to be equal to the third voltage value $V_3$. When the first voltage value $V_1$ is equal to the third voltage value $V_3$, the driving section 30 can use the power generated by the second power supply section 35 to change the gate voltage Vgs, i.e. the control voltage, of the FET 20 from the third voltage value $V_3$ to the second voltage value $V_2$, while using almost none of the power generated by the first power supply section 32. In this case, the driving section 30 can lengthen the switching time of the FET 20 by the maximum amount, as shown by $t_{10}$ in FIG. 12.

Instead of the above operation, the changing section 40 may change the amount of change per unit time used when changing the control voltage from the third voltage value $V_3$ to the first voltage value $V_1$. More specifically, when shortening the switching time, the changing section 40 can increase the amount of change per unit time when changing from the third voltage value $V_3$ to the first voltage value $V_1$ by decreasing the output resistance of the first power supply section 32, for example. Furthermore, when lengthening the switching time, the changing section 40 can decrease the amount of change per unit time when changing from the third voltage value $V_3$ to the first voltage value $V_1$ by increasing the output resistance of the first power supply section 32, for example.

The changing section 40 may change the amount of change per unit time when changing the control voltage from the first voltage value $V_1$ to the second voltage value $V_2$. For example, when shortening the switching time, the changing section 40 can increase the amount of change per unit time when changing from the first voltage value $V_1$ to the second voltage value $V_2$ by decreasing the output resistance, i.e. the resistor 39, of the second power supply section 35. Furthermore, when lengthening the switching time, the changing section 40 can decrease the amount of change per unit time when changing from the first voltage value $V_1$ to the second voltage value $V_2$ by increasing the output resistance of the second power supply section 35, for example.

In this way, the switching apparatus 10 can control the switching time of a switch using a simple configuration. More specifically, the switching apparatus 10 can control the switching time when switching the FET 20 from the first state to the second state to be a designated time.

As a modification of the present embodiment, the first voltage value $V_1$ may exceed the second voltage value $V_2$ and the first power supply section 32 may be a variable voltage power source that can generate a power supply voltage in a rated range of the gate voltage of the FET 20. In other words, when the second voltage value $V_2$ is higher than the third voltage value $V_3$, the first power supply section 32 may be a variable voltage power source that can generate the power supply voltage with the first voltage value $V_1$ that is greater than the second voltage value $V_2$ and less than or equal to the rated voltage of the gate voltage. Furthermore, when the second voltage value $V_2$ is lower than the third voltage value $V_3$, the first power supply section 32 may be a variable voltage power supply that can generate the control voltage with the first voltage value $V_1$ that is lower than the second voltage value $V_2$ and greater than or equal to the rated voltage of the gate voltage.

In such a case, the changing section 40 changes the first voltage value $V_1$ from the third voltage value $V_3$ to the rated voltage of the gate voltage, which exceeds the second voltage value $V_2$. As a result, the changing section 40 can change the switching time in a wider range.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching apparatus that switches a connection state between a first terminal and a second terminal, the apparatus comprising:
    a switch that switches the connection state according to a control voltage supplied thereto;
    a driving section that provides the switch with the control voltage corresponding to a control signal supplied thereto;
    a changing section that changes the control voltage output from the driving section, according to a designated switching time; and
    a calibration section for detecting the control voltage corresponding to the designated switching time prior to the switching of the switch, the calibration section configured to receive said control signal and to measure at least one of a voltage between the first terminal and the second terminal and an output voltage applied to a load connected to one of the first terminal and the second terminal, the calibration section further configured to perform at least one of changing the control voltage corresponding to the designated switching time and setting an adjustment amount by which a timing at which the control signal is supplied to the driving section is adjusted.

2. The switching apparatus according to claim 1, wherein the changing section changes power supplied by a power supply to the driving section, according to the designated switching time.

3. The switching apparatus according to claim 1, wherein the changing section changes the control voltage output from the driving section prior to switching of the switch.

4. The switching apparatus according to claim 1, wherein the switch is a field-effect transistor, and
    the driving section supplies the control voltage to a gate of the field-effect transistor.

5. The switching apparatus according to claim 4, wherein the changing section changes the control voltage in a range from a threshold voltage of the field-effect transistor to a maximum rated voltage of a gate voltage of the field-effect transistor.

6. The switching apparatus according to claim 1, further comprising:
a first power supply section that generates a power supply voltage with a first voltage value; and
a second power supply section that generate a power supply voltage with a second voltage value, wherein
upon receiving switching instructions to switch the switch from a first state to a second state, the driving section uses power generated by the first power supply section to change the control voltage to be the first voltage value at a first rate of change over time, and then uses power generated by the second power supply section to further change the control voltage from the first voltage value to the second voltage value at a second rate of change over time that is less than the first rate of change over time.

7. The switching apparatus according to claim 6, wherein the first power supply section generates the power supply voltage with the first voltage value from a first output terminal thereof and generates power supply voltage with a third voltage value from a second output terminal thereof,
the second power supply section generates the power supply voltage with the second voltage value from a first output terminal thereof and generates power supply voltage with the third voltage value from a second output terminal thereof, and
the driving section connects a control end of the switch to the second output terminals of the first power supply section and the second power supply section when instructions are received to switch the switch to the first state, and connects the control end of the switch to the first output terminals of the first power supply section and the second power supply section when instructions are received to switch the switch to the second state.

8. The switching apparatus according to claim 7, wherein the first voltage value of the first power supply section can be changed from outside, and
the changing section changes the power supply voltage with the first voltage value generated by the first power supply section within a range from the third voltage value to a rated voltage of the control voltage of the switch, which exceeds the second voltage value, according to the designated switching time.

9. The switching apparatus according to claim 1, further comprising a timing adjusting section that adjusts a timing at which the control signal is supplied to the driving section, according to the change of the control voltage by the changing section.

10. A test apparatus that tests a device under test, comprising:
a signal supplying section that supplies a test signal to the device under test;
a signal acquiring section that acquires a response signal output from the device under test in response to the test signal; and
a judging section that judges pass/fail of the device under test based on the response signal;
wherein the signal supplying section includes:
an output terminal connected to the device under test;
a high-voltage switching apparatus that provides a connection or a disconnection between a first terminal provided with a high reference voltage and a second terminal connected via a high-voltage switching apparatus connection to the output terminal, according to a positive control signal corresponding to a test pattern for testing the device under test, and
a low-voltage switching apparatus that provides a connection or a disconnection between a first terminal connected via a low-voltage switching apparatus connection to the output terminal and a second terminal provided with a low reference voltage, according to a negative control signal obtained by inverting a logic value of the positive control signal,
wherein the high-voltage switching apparatus and the low-voltage switching apparatus each include:
a switch that switches a connection state between the first terminal and the second terminal, according to a control voltage supplied thereto;
a driving section that supplies the switch with the control voltage corresponding to a control signal supplied thereto,
a changing section that changes the control voltage supplied from the driving section, according to a designated switching time, and
a calibration section for detecting the control voltage corresponding to the designated switching time prior to the switching of the switch, the calibration section configured to receive said control signal and to measure at least one of a voltage between the first terminal and the second terminal and an output voltage, wherein for the high-voltage switching apparatus the output voltage is measured at the high-voltage switching apparatus connection, and for the low-voltage switching apparatus the output voltage is measured at the low-voltage switching apparatus connection, the calibration section further configured to perform at least one of changing the control voltage corresponding to the designated switching time and setting an adjustment amount by which a timing at which the control signal is supplied to the driving section is adjusted.

11. A method of switching a connection state between a first terminal and a second terminal of a switch, comprising:
switching the connection state according to a control voltage supplied to the switch;
providing the switch with the control voltage from a driving section, the control voltage corresponding to a control signal supplied to the driving section;
changing the control voltage output from the driving section via a changing section according to a designated switching time; and
detecting the control voltage corresponding to the designated switching time prior to the switching of the switch via a calibration section, the calibration section configured to receive said control signal and to measure at least one of the voltage between the first terminal and the second terminal and an output voltage applied to a load connected to one of said the first terminal and the second terminal, the calibration section further configured to perform at least one of changing the control voltage corresponding to the designated switching time and setting an adjustment amount by which a timing at which the control signal is supplied to the driving section is adjusted.

* * * * *